United States Patent
Arnborg et al.

(10) Patent No.: US 7,563,682 B2
(45) Date of Patent: Jul. 21, 2009

(54) LDMOS TRANSISTOR DEVICE, INTEGRATED CIRCUIT, AND FABRICATION METHOD THEREOF

(75) Inventors: Torkel Arnborg, Stockholm (SE); Ulf Smith, Huddinge (SE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 12/119,773

(22) Filed: May 13, 2008

(65) Prior Publication Data

US 2008/0261359 A1    Oct. 23, 2008

Related U.S. Application Data

(62) Division of application No. 10/870,574, filed on Jun. 17, 2004, now Pat. No. 7,391,084.

(30) Foreign Application Priority Data

Jul. 18, 2003   (SE)   .................................. 0302108

(51) Int. Cl.
*H01L 29/76*    (2006.01)

(52) U.S. Cl. ........................ 438/289; 438/217; 438/301; 257/364; 257/E29.152

(58) Field of Classification Search ................. 438/142, 438/197, 199, 217, 279, 289, 301; 257/607, 257/655, 213, 288, 327, 335, 344, 408, 364, 257/E29.152
See application file for complete search history.

(56) References Cited

U.S. PATENT DOCUMENTS

| | | | |
|---|---|---|---|
| 5,252,848 A | 10/1993 | Adler et al. | |
| 5,844,272 A | 12/1998 | Soderbarg et al. | |
| 5,851,920 A * | 12/1998 | Taylor et al. | ................. 438/648 |
| 5,977,591 A | 11/1999 | Fratin et al. | |
| 6,080,629 A * | 6/2000 | Gardner et al. | ............... 438/301 |
| 6,306,738 B1 | 10/2001 | Selcuk | |
| 6,376,289 B1 | 4/2002 | Zingg | |
| 6,380,055 B2 * | 4/2002 | Gardner et al. | ............... 438/585 |
| 6,514,824 B1 | 2/2003 | Randazzo et al. | |
| 6,768,149 B1 | 7/2004 | Mann et al. | |
| 6,878,579 B2 | 4/2005 | Ohuchi et al. | |
| 6,902,945 B2 * | 6/2005 | Mann et al. | .................... 438/48 |
| 2002/0190287 A1 | 12/2002 | Mann | |

FOREIGN PATENT DOCUMENTS

| | | |
|---|---|---|
| JP | 04162726 A | 6/1992 |
| JP | 08213596 A | 8/1996 |

* cited by examiner

*Primary Examiner*—Matthew Smith
*Assistant Examiner*—Michele Fan
(74) *Attorney, Agent, or Firm*—Coats & Bennett, P.L.L.C.

(57) ABSTRACT

An LDMOS transistor device in an integrated circuit comprises a semiconductor substrate (10), a gate region (1) including a gate semiconductor layer region (2; 2'; 151) on top of a gate insulation layer region (3; 141), source (4) and drain (5, 7) regions, and a channel (6; 12) arranged beneath the LDMOS gate region, the channel interconnecting the LDMOS source and drain regions and having a laterally graded doping concentration. In order to obtain a lower parasitic capacitance coupling from the gate semiconductor region, the gate semiconductor layer region is provided with a laterally graded net doping concentration (P+N+; N+N−). A method for fabrication of the inventive LDMOS transistor device is further disclosed.

7 Claims, 7 Drawing Sheets

LDMOS TRANSISTOR DEVICE, INTEGRATED CIRCUIT, AND FABRICATION METHOD THEREOF

PRIORITY

This application claims priority to Swedish application no. 0302108-6 filed Jul. 18, 2003.

TECHNICAL FIELD OF THE INVENTION

The present invention generally relates to the field of integrated circuit technology, and more specifically the invention relates to an LDMOS (laterally double diffused MOS) transistor device, to an integrated circuit including the LDMOS transistor device, and to a fabrication method of the integrated circuit, respectively.

DESCRIPTION OF RELATED ART AND BACKGROUND OF THE INVENTION

In LDMOS transistors the channel length is typically defined by transport of dopants through ion implantation or diffusion and not by lithographic feature size. A first portion of the channel is based on a traditional MOS transistor with appropriate gate dielectric and doping level. A latter portion of the channel has a much lower doping but has still the same capacitive coupling from the polycrystalline silicon gate. By this, the transconductance of the device is improved, but the potential of the short channel length defined by the doping is not fully utilized since the latter portion of the channel has a parasitic capacitance, which is not desirable.

Typically, the improvement caused by the doping is accepted, whereas the parasitic capacitance of the latter portion of the channel is simply disregarded.

Nevertheless, there have been reports of using a non-uniform oxide thickness for different reasons. By increasing the thickness towards the drift region lower parasitic capacitance can be obtained.

SUMMARY OF THE INVENTION

Known solutions do not take the full improvement potential into account, or in the case of non-uniform oxide thicknesses they use difficult fabrication techniques. Feasible techniques include etching, growing a non-uniform oxide layer before deposition of the polycrystalline silicon gate, and using growth enhancement species. The gate oxide is very sensitive to etching damage and it is very difficult to change the thickness further away from the gate edge.

Accordingly, it is an object of the present invention to provide an LDMOS transistor device in an integrated circuit, particularly an integrated circuit for radio frequency applications, which overcomes the problems associated with the prior art described above.

Further, it is an object of the invention to provide a method in the fabrication of an integrated circuit, particularly an integrated circuit for radio frequency applications, including an LDMOS transistor, which accomplishes the above object.

These objects can be achieved by an LDMOS transistor device in an integrated circuit, particularly an integrated circuit for radio frequency applications, comprising a semiconductor substrate, an LDMOS gate region including a gate semiconductor layer region on top of a gate insulation layer region, LDMOS source and drain regions, and a channel region arranged beneath the LDMOS gate region, the channel region interconnecting the LDMOS source and drain regions and having a laterally graded doping concentration, wherein the gate semiconductor layer region of the LDMOS gate region has a laterally graded doping concentration.

The gate semiconductor layer region may have a net doping concentration, which decreases from a side thereof, which is adjacent the LDMOS source region, to another side thereof, which is adjacent the LDMOS drain region. The LDMOS transistor device can be an n-channel device, and the gate semiconductor layer region can be doped to N+ in a part thereof, which is closest to the LDMOS source region, and to N− in a part thereof, which is closest to the LDMOS drain region. The part of the gate semiconductor layer region closest to the LDMOS source region may have a net doping of between 1018 cm-3 and 1022 cm-3, whereas the part of the gate semiconductor layer region closest to the LDMOS drain region has a net doping of between 1011 cm-3 and 1015 cm-3. The LDMOS transistor device can be an n-channel device, and the gate semiconductor layer region can be doped to P+ in a part thereof, which is closest to the LDMOS source region, and to N+ in a part thereof, which is closest to the LDMOS drain region. The LDMOS transistor device can be a p-channel device.

The object can also be achieved by a method in the fabrication of an integrated circuit, particularly an integrated circuit for radio frequency applications, including an LDMOS transistor, comprising the steps of:

providing a semiconductor substrate, forming LDMOS source and drain regions in the substrate, forming a channel region in the substrate between the LDMOS source and drain regions and with a laterally graded net doping concentration, and forming an LDMOS gate region on the substrate, the LDMOS gate region including a gate semiconductor layer region on top of a gate insulation layer region, wherein the gate semiconductor layer region of the LDMOS gate region is formed with a laterally graded net doping concentration.

The gate semiconductor layer region can be formed with a net doping concentration, which decreases from a side thereof, which is adjacent the LDMOS source region, to another side thereof, which is adjacent the LDMOS drain region. The LDMOS gate region is formed through the steps of:

forming a gate oxide layer on the substrate, forming a polycrystalline silicon gate layer thereon, forming by means of patterning and etching a layer region thereon to be used as a hard mask for formation of the LDMOS gate region, forming a screen layer thereon, forming a first protecting layer thereon, the first protecting layer being patterned so as to cover the patterned and etched layer region partly, implanting ions in the polycrystalline silicon gate layer through the screen layer, the first protecting layer preventing ions from being implanted through the first protecting layer, removing the first protecting layer, removing the screen layer, and etching the polycrystalline silicon gate layer and the gate oxide layer using the patterned and etched layer region as a mask to thereby form the gate semiconductor layer region on top of a gate insulation layer region.

The step of implanting may comprise to implant ions through the patterned and etched layer region. The patterned and etched layer region may prevent ions from being implanted through the patterned and etched layer region in the step of implanting. The step of implanting can be performed with ions of a first doping type, and ions of a second doping type are implanted into the polycrystalline silicon gate layer prior to the formation of the patterned and etched layer region. The step of implanting can be performed with ions of a first doping type, and the method may comprise the further steps performed between the two steps of removing:

forming a second protecting layer on the screen layer, the second protecting layer being patterned so as to cover the patterned and etched layer region essentially complementary to the first protecting layer, and implanting ions of a second doping type in the polycrystalline silicon gate layer through the screen layer, the second protecting layer preventing ions from being implanted through the second protecting layer.

By means of providing the gate semiconductor layer region of the LDMOS gate region of the LDMOS transistor device with a laterally graded net doping concentration the gate capacitance can be reduced, thereby increasing the operating speed. Alternatively, a higher transconductance is obtained without the gate capacitance being affected, which also provides for an LDMOS transistor device with higher speed.

Further, according to another aspect of the present invention there is provided an integrated circuit comprising at least one LDMOS transistor as depicted above.

Further characteristics of the invention and advantages thereof will be evident from the detailed description of preferred embodiments of the present invention given hereinafter and the accompanying FIGS. 1-13, which are given by way of illustration only, and thus are not limitative of the present invention.

DETAILED DESCRIPTION OF PREFERRED EMBODIMENTS

Figure 1:
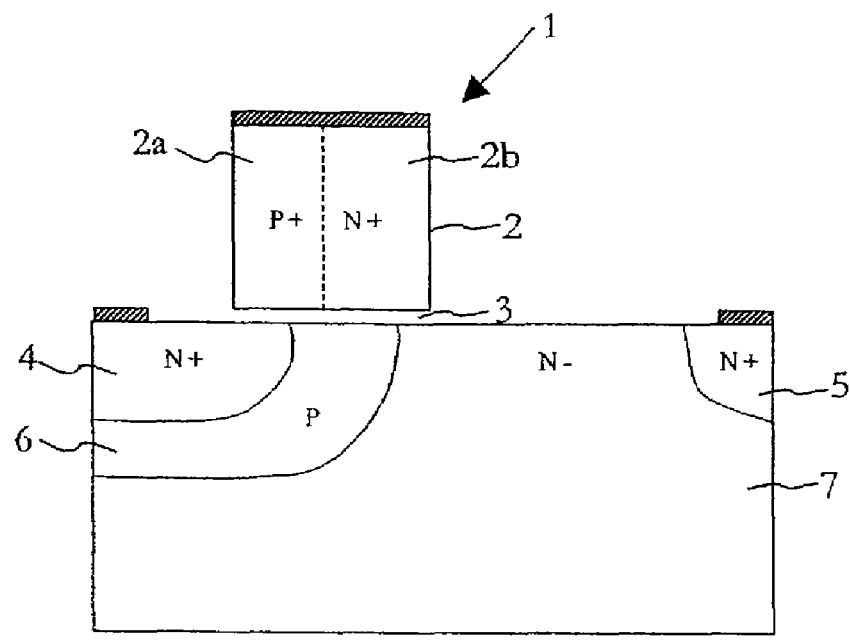
FIGS. 1 and 2 are each a highly enlarged cross-sectional view of an LDMOS transistor device according to a respective preferred embodiment of the present invention.

In FIG. 1 is shown, in an enlarged cross-sectional view, an n-channel LDMOS transistor device according to a first preferred embodiment of the present invention. The LDMOS transistor device, which is particularly adapted for high power radio frequency applications, comprises an N− type doped semiconductor substrate 7, in which a P type doped well 6 is formed. N+ type doped source 4 and drain 5 regions are formed in the P type doped well 6 and the N− type doped substrate 7, respectively. The N+ type doped drain region 5 is formed at a distance from the P type doped well 6, wherein an upper portion of the N− type doped substrate 7, which exists between the P type doped well 6 and the N+ type doped drain region 5 is part of the drain of the LDMOS transistor. Above the P type doped well 6 an LDMOS gate region 1 is formed including a gate semiconductor region 2, preferably of polycrystalline silicon, on top of a gate insulation, preferably oxide, region 3.

Further, the LDMOS transistor device includes a channel region arranged beneath the LDMOS gate region in the P type doped well 6. The channel region, which extends from the LDMOS source region 4 to the LDMOS region drain 5 region, has a laterally graded doping concentration. Typically, the part of the channel region closest to the source region 4 is based on a traditional MOS transistor, whereas the part of the channel region closest to the drain region 5 has a much lower doping concentration.

In order to not only obtain an improved transconductance of the transistor, but also a lower parasitic capacitance coupling from the gate semiconductor region 2, also the gate semiconductor region 2 has a laterally graded doping concentration. The gate semiconductor region 2 of the preferred embodiment of the LDMOS transistor device illustrated in FIG. 1 is doped to P+ in a part 2a thereof, which is closest to the source region 4, and to N+ in a part 2b thereof, which is closest to the drain region 5. This inventive transistor gate is in the following referred to as an N+P+ gate.

Figure 2:
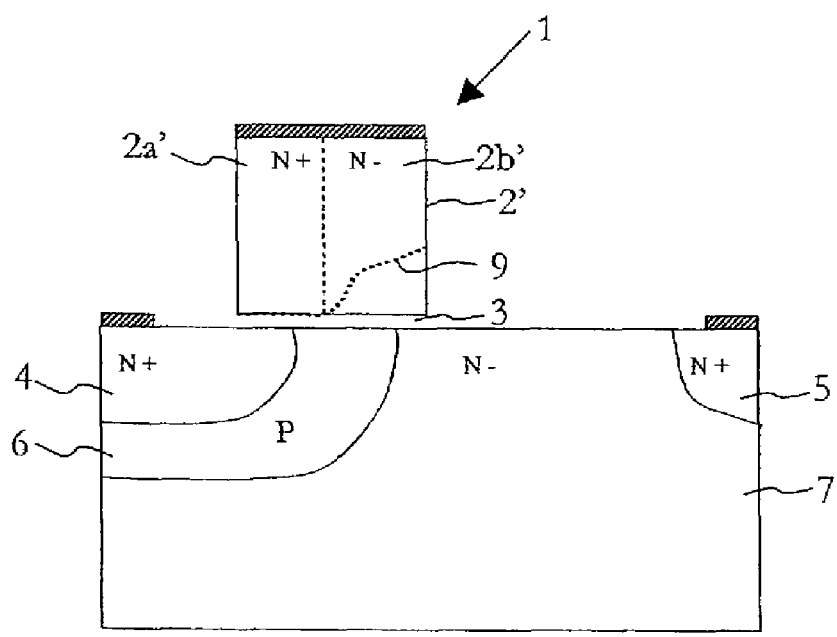

In FIG. 2 is shown, in an enlarged cross-sectional view, an n-channel LDMOS transistor device according to a second preferred embodiment of the present invention. This embodiment differs from the previous embodiment only with respect to the gate doping. The gate semiconductor region 2, in this embodiment denoted by 2', is doped to N+ in the part 2a' closest to the source region 4 and to N− in the part 2b' closest to the drain region 5. This transistor gate is in the following referred to as an N+N− gate.

Figure 3:
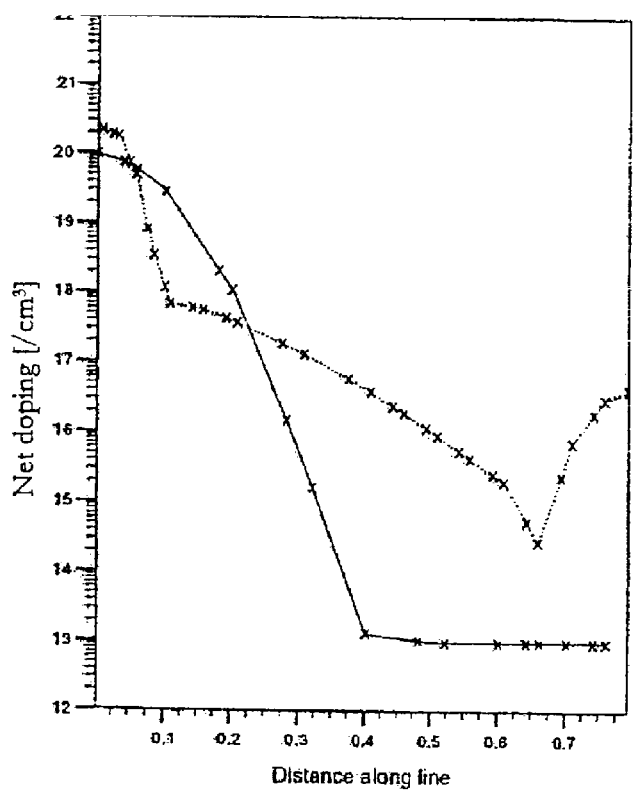
FIG. 3 is a diagram of the net doping versus lateral dimension for the gate and the channel of the LDMOS transistor device of FIG. 2 according to a preferred embodiment of the present invention.

An example of the net doping versus lateral dimension for the gate (solid line) and the channel (dotted line) of the LDMOS transistor device of FIG. 2 is shown in FIG. 3. In conventional LDMOS devices, the gate is doped with a constant density of about $10^{20}$ cm$^{-3}$, but for the invention a doping with a lateral gradient is used. To the contrary, the gate dopant concentration illustrated in FIG. 3 drops from source to drain from about $10^{20}$ cm$^{-3}$ to about $10^{13}$ cm$^{-3}$ along a distance of about 0.4 microns. The channel doping has also a considerable slope from source to drain between the junctions.

However, it shall be appreciated that the type of doping and gradient magnitude to obtain the non-uniform doping of the gate according to the present invention can be chosen in various manners in order to obtain desired properties.

Two important parameters, the transconductance and the capacitance, determine the speed of the device. The threshold voltage will influence the effective channel length and the transconductance. The presence of a depletion layer in the low-doped polycrystalline gate of the LDMOS device of FIG. 2 will reduce the capacitance. The depletion layer in the polycrystalline silicon gate can only exist for some bias cases. If accumulation or inversion of any carrier occurs, the capacitance will be the same as for a highly doped gate. However, for the most important bias conditions we will have a depletion layer and thus a reduced capacitance.

For the n-channel transistor the inventive LDMOS transistor with N+N− gate will have the same threshold voltage and gate capacitance as a conventional N+ polycrystalline gate LDMOS transistor below the highly doped part of the gate. On the low-doped gate side, the depletion layer boundary will spread out, indicated by 9 in FIG. 2, and reduce the capacitance. The total capacitance will thus be reduced, thereby increasing the operating speed.

The inventive LDMOS transistor with P+N+ gate, on the other hand, will have higher transconductance, but the same gate capacitance, which also gives higher speed. The threshold voltage will in this case increase.

Power LDMOS devices are usually fabricated using a finger array layout. Two-dimensional device simulations have been carried out on such a finger cross-section for (i) the inventive N+N− LDMOS transistor device and (ii) for the conventional LDMOS transistor with homogenously doped gate as a comparison. The device width is assumed to be 1 micron.

Figure 4:
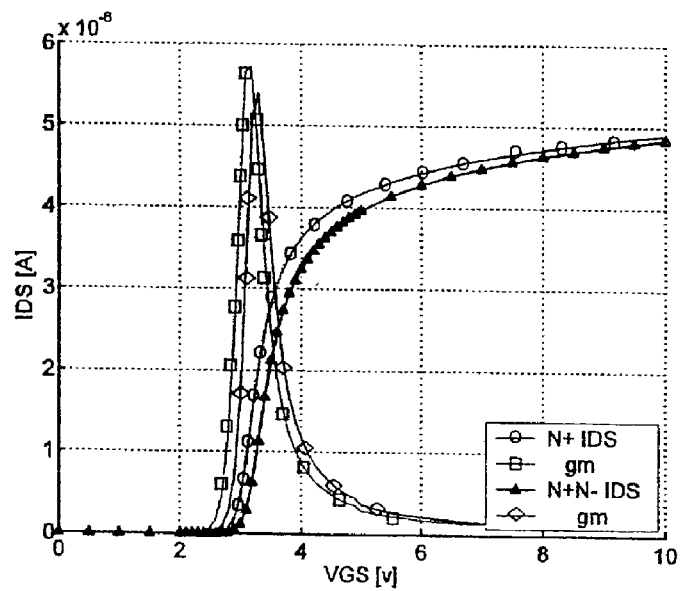
FIGS. 4-8 are diagrams illustrating various transistor characteristics of the LDMOS transistor device of FIG. 2 as retrieved by means of simulations.
Figure 5:
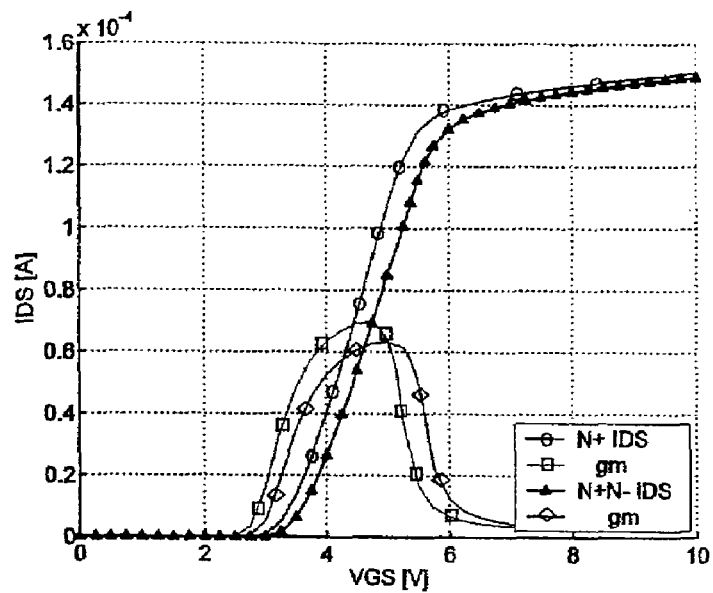

In FIGS. 4 and 5 drain-source current, IDS, versus gate-source voltage, VGS, is shown for low and high drain voltages for an inventive transistor device as described with reference to FIG. 2 (triangles) and for a conventional LDMOS transistor device with a highly doped gate (circles). In the Figures also the derivative d(IDS)/d(VGS) is shown for the inventive device (squares) and for the conventional device (rhombs). The difference is small with the largest difference mainly in the high current region. This can be avoided by moving the pn-junction at the end of the channel, more beneath the gate. In this case this could be driving a reduced surface field doping in the drift region for a longer time.

Figure 6:
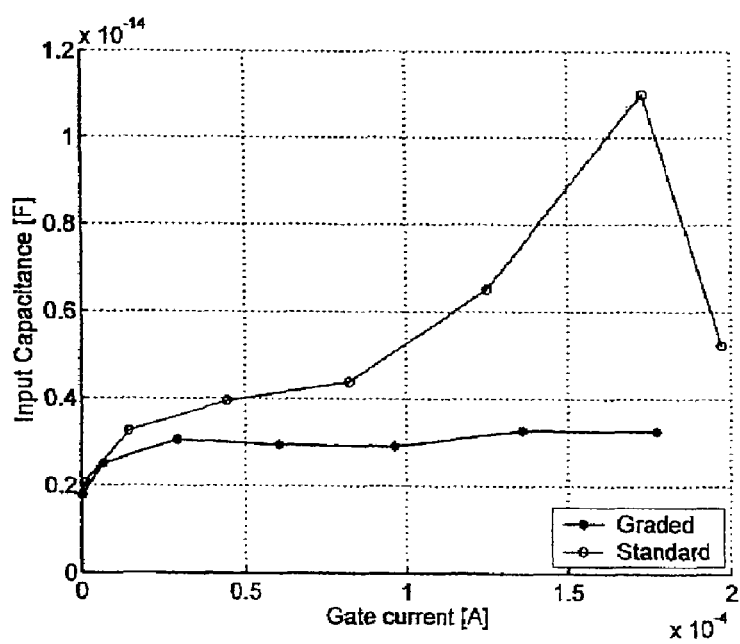

In FIG. 6, the input capacitance versus drain current is shown, varying the gate voltage at constant drain voltage, for the inventive LDMOS device (stars) and a conventional LDMOS device (circles). The difference is small for lower currents, but as the gate voltage is increased the low-doped part of the polycrystalline silicon gate of the inventive LDMOS device is depleted and the capacitance is reduced.

Figure 7:
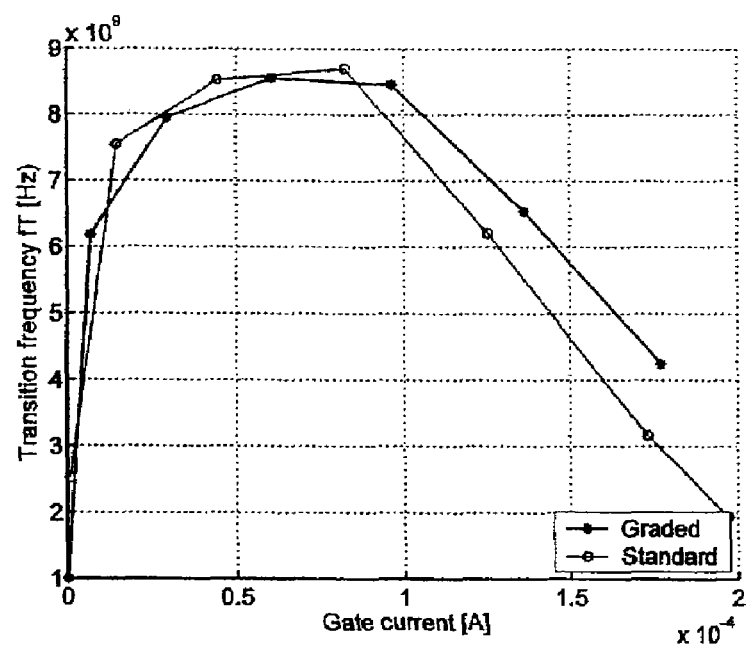

In FIG. 7 the transition or unity-gain frequency, fT, versus drain current is shown. The inventive LDMOS transistor is faster than the standard transistor.

Figure 8:
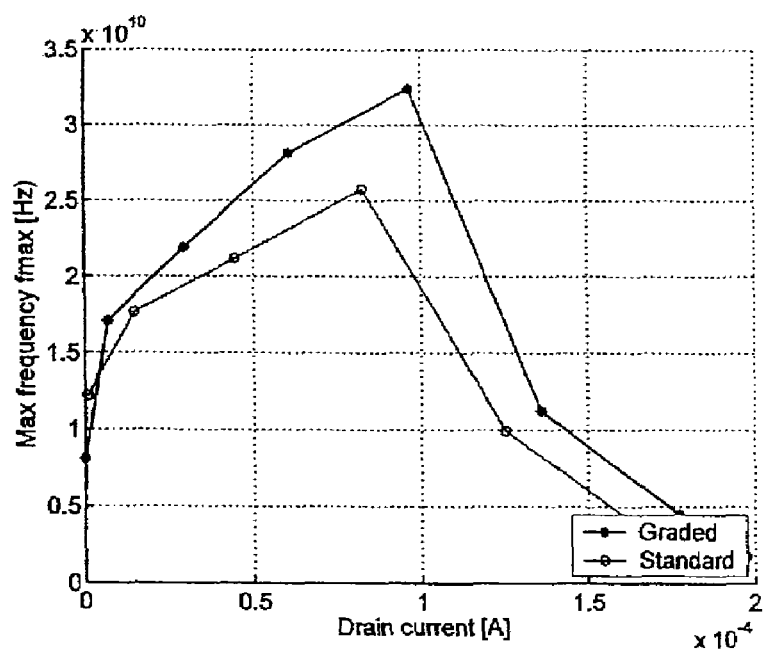

In FIG. 8 the maximum frequency of oscillation, fmax, versus drain current is shown. The improvement is higher in this case for several reasons. The maximum oscillation frequency, fmax, is in addition to being dependent on the transition frequency, fT, also dependent on a capacitance between the gate and the drain and on a real part of the gate impedance, and these contributions are also smaller for the inventive LDMOS transistor device.

The improvement in performance by the inventive LDMOS transistor device will be much larger for future technologies following the ongoing standard scaling of devices and circuits. The threshold voltage differences along the channel, which are in the order of a volt, will have a much larger impact on the electrical transistor properties for supply voltages in that order.

It shall be appreciated that while the illustrated preferred embodiments of the LDMOS transistor are n-channel devices, the present invention is not limited in this respect. The invention is equally applicable to p-channel devices.

It shall further be appreciated that while the present invention is primarily intended for radio frequency power silicon LDMOS devices, it may as well be useful for smaller devices in silicon-based integrated radio frequency circuits. Further, the LDMOS device of the present invention may be realized in other materials such as e.g. SiC, GaAs, etc. if the gate insulator layers are modified accordingly.

Below, three different preferred example embodiments for manufacturing LDMOS transistors of the present invention are depicted.

EXAMPLE EMBODIMENT 1

Figure 9:
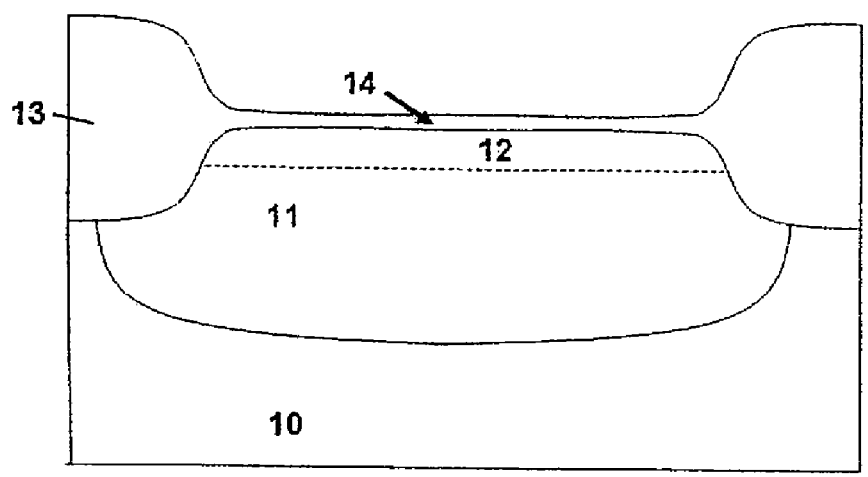
FIGS. 9-13 are highly enlarged cross-sectional views of a portion of a semiconductor structure during processing according to preferred example embodiments of the present invention.
Figure 10:
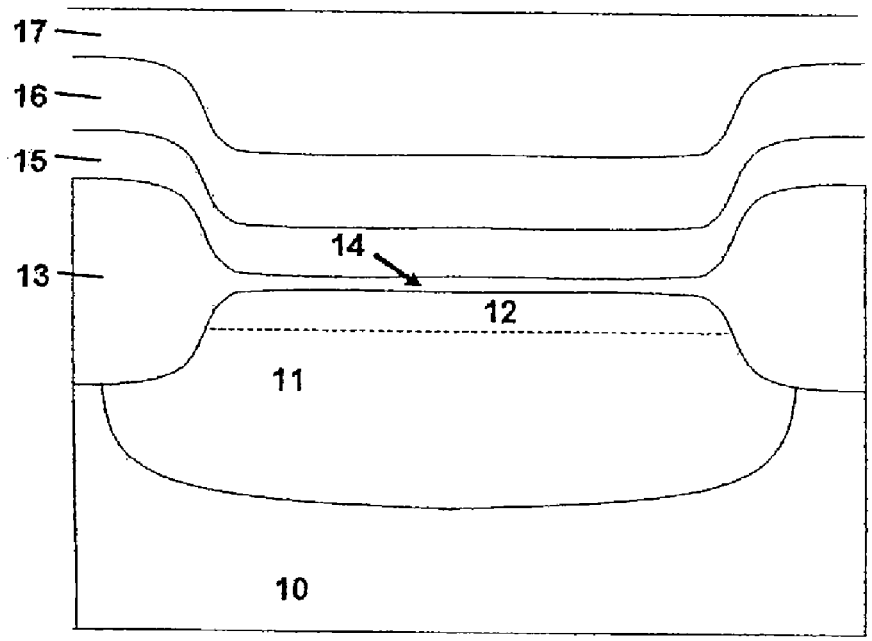

FIG. 9 shows a cross section of a semiconductor structure including a partially processed MOS transistor. The MOS transistor can be of either P or N type. The type will only influence the choice of dopant atom for the polycrystalline silicon in the transistor gate. The nature of the choice is well known to the person skilled in the art. The process steps leading up to the structure shown in FIG. 9 are also well known to the person skilled in the art and these steps will therefore not be further described here. In FIG. 10, reference numeral 10 denotes a silicon substrate, 11 denotes a well, 12 denotes a channel adjustment, 13 denotes a field oxide, and 14 denotes a gate oxide layer.

On top of the gate oxide layer 14 and the field oxide 13 a polycrystalline silicon layer 15 is deposited. The polycrystalline silicon layer 15 is undoped at this stage. A layer 16 consisting of silicon nitride is deposited thereon. The layer 16 can alternatively be a bi-layer consisting of silicon nitride on top of silicon dioxide, which allows the mechanical stress in the underlying polycrystalline silicon layer 15 to be controlled. Such stress control will provide a further opportunity to influence the diffusion of dopant into what will become the laterally graded gate. The silicon nitride layer 16 is covered by a layer 17, which consists of photo resist. The photo resist layer 17 is used to pattern the silicon nitride layer 16 by means of, for example, anisotropic reactive etching in a manner well known in the art. The resulting structure is shown in FIG. 10.

Figure 11:
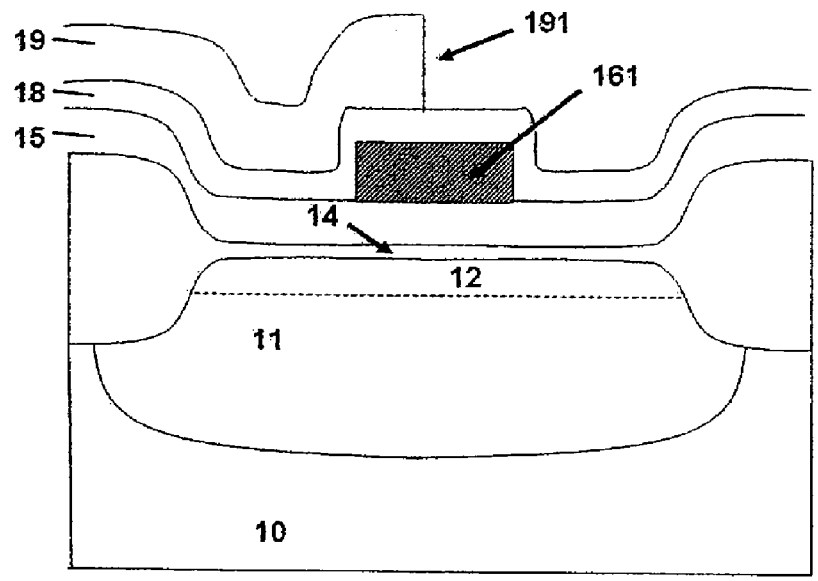

The photo resist layer 17 is patterned and the silicon nitride layer 16 is etched to form a region 161, which is shown in FIG. 11. The region 161 will later in the process be used as a mask for the etching the underlying polycrystalline silicon layer 15 and gate oxide layer 14 in order to form a transistor gate. The lateral dimensions of the region 161 correspond to the desired lateral dimensions of the transistor gate. In the cross section of FIG. 11, the visible dimension of the region 161 corresponds to the length of the transistor gate.

A layer 18 of silicon dioxide is then deposited on the structure. This oxide will be used as a screen oxide during the implantation of dopants into the polycrystalline silicon layer 15 and as a means to prevent the escape of dopants from the polycrystalline silicon layer 15 during a later performed diffusion and activation anneal. A layer 19 of photo resist is then deposited and patterned in such a way that an edge 191 of the photoresist is located on top of the silicon nitride region 161. The resulting structure is shown in FIG. 11.

Next, the polycrystalline silicon layer 15 is implanted with a selected polycrystalline silicon gate dopant. The implant dose is selected so as to obtain the required concentration level and lateral concentration gradient in the completed transistor gate. The implant energy is selected in such a manner that (i) the implant dose ends up in the center of the polycrystalline silicon layer 15 and (ii) the ions are not only stopped by the photo resist layer 19, but also by the silicon nitride region 161.

Another strength of the present invention becomes clear at this stage, namely that the position of the photo resist edge 191 on top of the silicon nitride region 161 will not be critical since the edge of the implanted region is defined by silicon nitride region 161. This also puts a lower limit on the thickness of the silicon nitride layer 16. If, on the other hand, a further tailoring of the lateral dopant concentration gradient of the transistor gate is desired, this can be achieved by selecting the thicknesses of silicon nitride layer 16 and the energy of the implant in such a manner that the part of the silicon nitride region 161 that is not covered by the patterned photo resist layer 19, i.e. as far as to the resist edge 191, is also to some extent penetrated by the implanted ions.

The patterned photo resist layer 19 is then removed and the wafer is subjected to an anneal, which serves to activate the implant and to cause the dopant ions to diffuse in beneath the silicon nitride region 161, thus forming a laterally graded gate structure.

Figure 12:
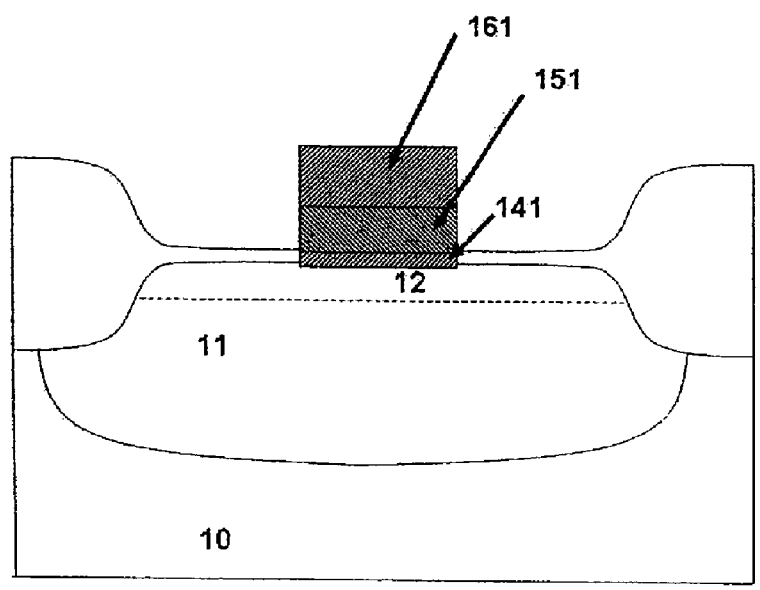
Figure 13:
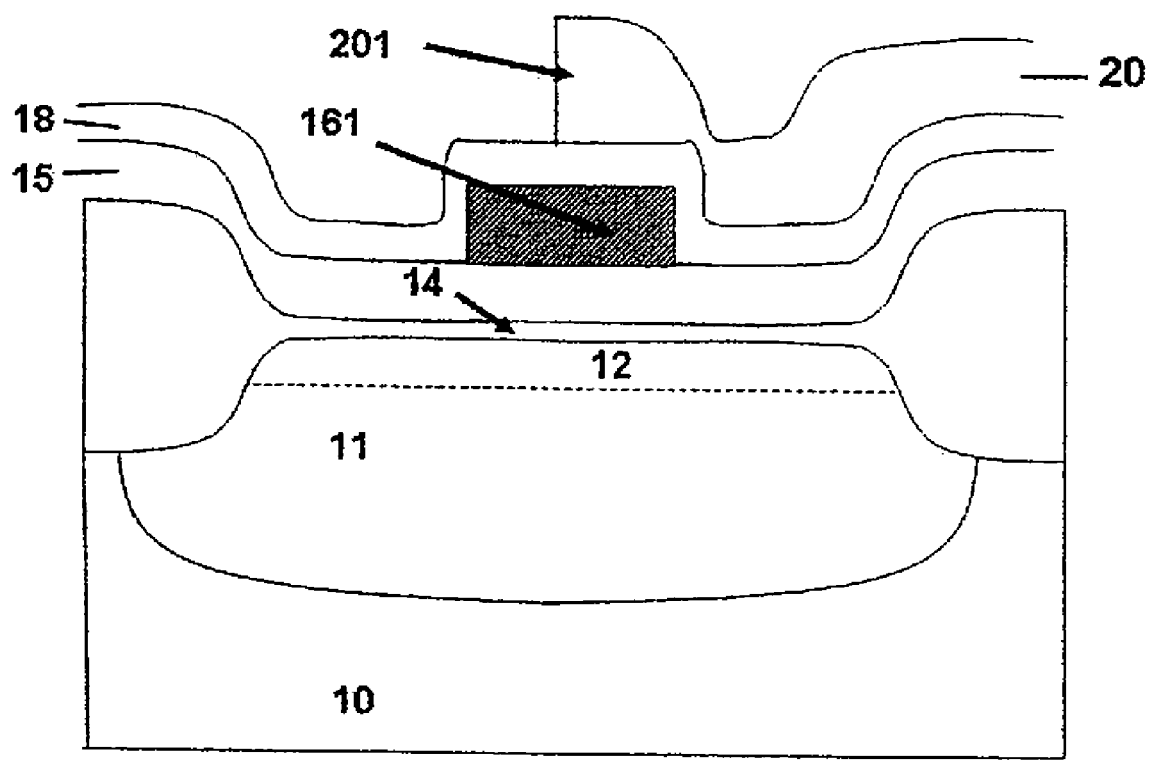

The silicon nitride region 161 is then used as a hard mask to etch the polycrystalline silicon layer 15 and the gate oxide layer 14, preferably using selective etching, to form the transistor gate including a polycrystalline silicon gate region 151 on top of a gate oxide region 141, as shown in FIG. 12.

The silicon nitride region 161 is then removed by means of selective etching. Further processing of the semiconductor structure and the inventive MOS transistor is performed according to methods well known to the person skilled in the art. It should, however, be remarked here that the source and drain implant activation anneal, which follows later in the processing of the MOS transistor, will reduce the gradient in the polysilicon gate to some extent. The reason for this is that at this stage there is no supply of dopant from the surrounding polycrystalline silicon layer, since this has been etched away in the formation of the transistor gate.

EXAMPLE EMBODIMENT 2

The processing in this example embodiment is similar to that of the previous embodiment except of that the polycrystalline silicon layer 15 is already in connection with its deposition doped to either P or N type.

The subsequent implantation using the patterned photo resist layer 19 is performed as in the previous embodiment except of that the implant is N type if the initial doping of the polycrystalline silicon layer 15 was P and vice versa. The dose is chosen in such a manner that this implant is not only large enough to compensate for the dopant already present in the polycrystalline silicon layer 15, but also large enough to change the net doping to that of the opposite type.

This will produce an N or P doped transistor gate that has a laterally graded dopant concentration in such a manner that the dopant concentration is predominantly P type at one end of the gate and predominantly N type at the other end.

EXAMPLE EMBODIMENT 3

The processing in this embodiment is similar to that of the first example embodiment except of the following. Subsequent to the first implantation of dopant into the originally undoped polycrystalline silicon layer 15, using the patterned photo resist layer 19 with its photo resist edge 191, this patterned photo resist layer 19 is removed and replaced by another photo resist layer 20, which is patterned is such a way that it covers the previously unprotected parts of the semiconductor structure, i.e. the patterned photo resist layer 20 is complementary to the patterned photo resist layer 19 above the MOS transistor. Thus, the already implanted areas of the MOS transistor are now protected by the patterned photo resist layer 20. This is shown in FIG. 14, wherein the photo resist edge 201 of the patterned photo resist layer 20 is indicated.

A second implant into the originally undoped polycrystalline silicon is then made using a dopant that produces an implanted area of the opposite type to that of the first implant.

Thus, the transistor gate will obtain a laterally graded dopant concentration in such a manner that the dopant concentration is predominantly P type at one end of the gate and predominantly N type at the other end, i.e. similar to the transistor gate of the previous example embodiment. The difference is that in this example embodiment all the dopant ions can be utilized in doping the opposite ends of the gate to P and N type, respectively. This is in contrast to the previous example embodiment, wherein the dose of the second implant had to be chosen large enough so as to (i) compensate for the initial doping of the polycrystalline silicon layer 15, and (ii) reversing the doping to the opposite type.

The invention claimed is:

1. A method in the fabrication of an integrated circuit, particularly an integrated circuit for radio frequency applications, including an LDMOS transistor, comprising the steps of:
   providing a semiconductor substrate,
   forming LDMOS source and drain regions of a first doping type in said substrate wherein the LDMOS drain region comprises a lighter and a heavier doped region,
   forming a channel region of a second doping type opposite of the first doping type in said substrate between said LDMOS source and drain regions and with a laterally graded net doping concentration, and
   forming an LDMOS gate region on said substrate, said LDMOS gate region including a gate semiconductor layer region on top of a gate insulation layer region, wherein
   the gate semiconductor layer region of said LDMOS gate region is formed with a laterally graded net doping concentration in a portion of the gate semiconductor layer region arranged directly over the channel region.

2. The method of claim 1, wherein said gate semiconductor layer region is formed with a net doping concentration, which decreases from a side thereof, which is adjacent said LDMOS source region, to another side thereof, which is adjacent said LDMOS drain region.

3. The method of claim 1, wherein said LDMOS gate region is formed through the steps of:
   forming a gate oxide layer on said substrate,
   forming a polycrystalline silicon gate layer thereon,
   forming by means of patterning and etching a layer region thereon to be used as a hard mask for formation of said LDMOS gate region,
   forming a screen layer thereon,
   forming a first protecting layer thereon, said first protecting layer being patterned so as to cover said patterned and etched layer region partly,
   implanting ions in said polycrystalline silicon gate layer through said screen layer, said first protecting layer preventing ions from being implanted through said first protecting layer,
   removing said first protecting layer,
   removing said screen layer, and
   etching said polycrystalline silicon gate layer and said gate oxide layer using said patterned and etched layer region as a mask to thereby form said gate semiconductor layer region on top of a gate insulation layer region.

4. The method of claim 3, wherein said step of implanting comprises to implant ions through said patterned and etched layer region.

5. The method of claim 3, wherein said patterned and etched layer region prevents ions from being implanted through said patterned and etched layer region in said step of implanting.

6. The method of claim 3, wherein said step of implanting is performed with ions of the first doping type, and ions of the second doping type are implanted into said polycrystalline silicon gate layer prior to the formation of said patterned and etched layer region.

7. The method of claim 3, wherein said step of implanting is performed with ions of the first doping type, and said method comprises the further steps performed between said two steps of removing:
   forming a second protecting layer on said screen layer, said second protecting layer being patterned so as to cover said patterned and etched layer region essentially complementary to said first protecting layer, and implanting ions of the second doping type in said polycrystalline silicon gate layer through said screen layer, said second protecting layer preventing ions from being implanted through said second protecting layer.

* * * * *